United States Patent
Kern

(10) Patent No.: US 6,218,614 B1
(45) Date of Patent: Apr. 17, 2001

(54) ELECTRICAL COMPONENT

(75) Inventor: Josef Kern, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/242,686

(22) PCT Filed: Aug. 6, 1997

(86) PCT No.: PCT/DE97/01658

§ 371 Date: Feb. 22, 1999

§ 102(e) Date: Feb. 22, 1999

(87) PCT Pub. No.: WO98/08242

PCT Pub. Date: Feb. 26, 1998

(30) Foreign Application Priority Data

Aug. 21, 1996 (DE) .............................. 196 33 727

(51) Int. Cl.[7] .................................................. H05K 5/03
(52) U.S. Cl. .................. 174/50; 174/66; 220/241
(58) Field of Search .............. 174/50, 66, 35 R, 174/35 C; 220/241, 3.8

(56) References Cited

U.S. PATENT DOCUMENTS

| | | | | |
|---|---|---|---|---|
| 3,010,199 | * | 11/1961 | Smith et al. ........................... | 29/509 |
| 5,159,537 | * | 10/1992 | Okano ................................. | 174/35 R |
| 5,175,395 | * | 12/1992 | Moore ................................. | 174/35 R |
| 6,037,541 | * | 3/2000 | Bartley et al. ........................ | 174/66 |

FOREIGN PATENT DOCUMENTS

| | | |
|---|---|---|
| GM 79 33 068 | 2/1980 | (DE) . |
| 91 11 106 U | 2/1993 | (DE) . |
| WO 95/14366 | 5/1995 | (WO) . |

OTHER PUBLICATIONS

Patent Abstracts of Japan, Nissin Electric Co. Ltd; vol. 007–No. 212, Published Jun. 24, 1983, No. 58106463, Kano Takaharu.

* cited by examiner

*Primary Examiner*—Dean A. Reichard
(74) *Attorney, Agent, or Firm*—Schiff Hardin & Waite

(57) ABSTRACT

A component, in particular a relay or other electromechanical component, has a parallelepipedal housing whose outer sides respectively have projections in the form of ribs or nubs integrally formed on them. As a result of this, impact stresses occurring when the component is handled are absorbed up to a defined magnitude and, above this specified magnitude, are identified externally by damage to the projections. This prevents components from being fitted despite invisible prior damage and from subsequently failing due to the invisible prior damage.

14 Claims, 2 Drawing Sheets

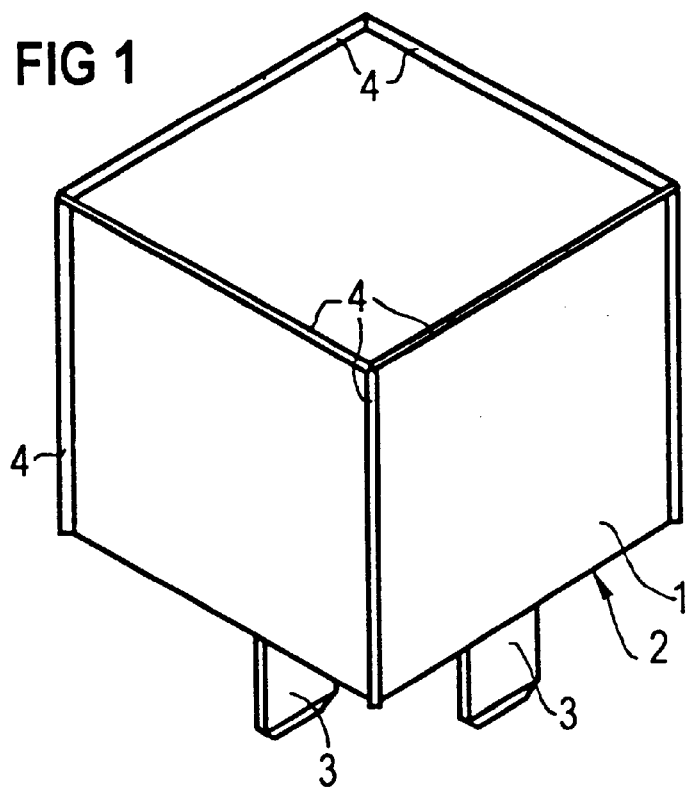
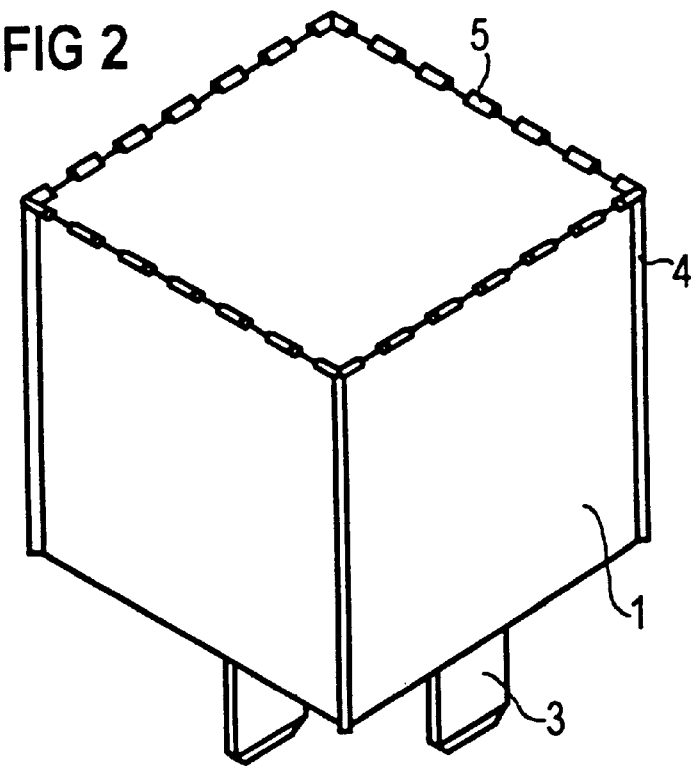

ELECTRICAL COMPONENT

FIELD OF THE INVENTION

The invention relates to an electrical component having a housing in the form of a block and having connection pins emerging on at least one housing side. In particular, the invention relates to electromechanical components, such as relays, relay modules and the like.

BACKGROUND OF THE INVENTION

As a result of handling errors during assembly, electromagnetic relays, electromechanical modules and devices can fall onto the ground and therefore need to be drop-resistant, i.e. they must endure the impact resulting from being dropped from a specified height of, for example, 1 or 2 meters without suffering any internal damage or functional limitation. In order to prevent a component which looks undamaged on the outside from proving to be inoperable on account of such damage after fitting, it is necessary either for the device to endure free fall from a defined height without suffering any prior damage, or for the damage to be visible on the outside as well.

Housings for relays, modules and devices are usually designed to be planar over a large area on the outside to allow the use of as large an interior as possible, and have ribs and projections in the interior in order to secure the component against impact and shock stress. As the impact absorption of plastic housings is very small, the latter also having to ensure mechanical protection of the components and therefore being made of a high-strength plastic, the component in the housing requires a relatively large additional expense in terms of design so that it will survive a drop test without suffering any hidden damage. This large additional expense is required only for the infrequently occurring situation in which the component is dropped owing to a handling error before it is actually used. When the specifically, when component is in normal use, such impact stresses will not occur throughout its entire life.

SUMMARY OF THE INVENTION

An object of the present invention is to use as little outlay as possible to design a housing for an electrical component such that unacceptable impact stresses can be reliably identified from the outside, it being possible to dimension this design appropriately to match the permissible limit up to which the functional elements in the interior of the component endure impacts without any damage.

The invention achieves this object by virtue of the fact that the outer sides of the housing are respectively provided with deformable projections which protrude beyond the outer contours of the housing on all sides—with the possible exception of housing sides having protruding connection elements.

These inventive projections in the form of ribs or nubs may be integrally formed on the outer surfaces or preferably on the outer edges of the housing, it being possible for them to be formed easily from plastic, together with the actual housing, using the injection molding process, with the result that there is hardly any extra additional expense. The appropriately thin-walled design of these projections, which may take any shape, makes them less dimensionally stable than the rest of the housing, which has thick walls, so that they deform when the component hits a hard floor from an appropriate drop height. With a small drop height, the energy stored by the mass of the component in free fall is absorbed in the projections on the housing, so that the negative acceleration is reduced considerably and the component in the interior of the housing is protected against hidden damage. The dimensions of the projections in terms of their height, cross sections and shape as ribs or nubs may be matched to the component and its application. In this way, the type and dimensions of the projections can take account of the mass of the component, the housing plastic used and also the prescribed drop height which the component must endure without damage.

The projections on the outer edges or housing surfaces may, as mentioned, be made of the same material as the housing itself. Alternatively, they may be made of an elastic plastic together with the housing using the two-component injection molding process; in this instance, the component housing is expediently produced from a plastic of greater stiffness, whilst the projections are correspondingly less stiff.

Since the inventive design means that the damage mentioned for the case of incorrect handling, which damage occurs only in very rare instances, is reliably identified, the impact stress on the component itself, i.e. its functional elements, may be relatively low, so that it is sufficient for smaller impacts in normal use. This means that the materials used in the component may, under some circumstances, be replaced by a cheaper material of lower strength; in other instances, it is also possible to reduce the cross section of individual structural elements, which saves on cost. Consequently, the outlay for the instance of impact stress in the event of an infrequently occurring handling error can therefore be reduced, thus reducing costs. The dimensions of the projections and the choice of material allow handling errors to be identified when the projections have been damaged on the outside, whether as a result of having been snapped off or of having been deformed. The component can be rejected by sorting so that the prior damage does not cause failure during operation of the device.

In an embodiment, the present invention provides an electrical component comprising a housing including a first side through which a plurality of connecting elements extend and five other sides. The five other sides each comprising at least one deformable projection extending outwardly therefrom. The at least one deformable projection of the five other sides being elastically deformable up to a specified impact stress and deformable at impact stresses exceeding the specified impact stress.

In an embodiment, the housing is fabricated from a plastic and the five other sides and the deformable projections are integrally formed from said plastic.

In an embodiment, the five other sides of the housing are fabricated from a first plastic material and the deformable projections are fabricated from a second plastic material. The first plastic material has a greater stiffness than the second plastic material. The five other sides and the deformable projections are injection molded using a two-component injection molding process.

In an embodiment, the housing is parallelpiped-shaped and the five other sides define eight edges. The deformable projections being disposed along said eight edges.

In an embodiment, the housing is cubically shaped and the five other sides define eight edges. The deformable projections being disposed along the eight edges.

In an embodiment, the deformable projections comprise elongated ribs.

In an embodiment, the deformable projections comprise nubs.

In an embodiment, the deformable projections comprise interrupted ribs.

In an embodiment, the present invention provides an electrical component that comprises a cubically shaped housing comprising a base through which a plurality of connecting pins extend, four sidewalls and a top wall. The four sidewalls defining four vertical edges and the four sidewalls and top wall defining four horizontal edges. The vertical and horizontal edges each comprising at least one deformable projection extending outwardly therefrom. Each deformable projection being elastically deformable up to a predetermined impact stress and deformable at impact stresses exceeding the predetermined impact stress.

Other objects and advantages of the present invention will become apparent from reading the following detailed description and appended claims, and upon reference to the accompanying drawings.

BRIEF DESCRIPTION OF THE DRAWINGS

The invention is explained in more detail below using exemplary embodiments with the aid of the drawing, wherein:

FIG. 1 shows a relay designed according to the invention,

FIG. 2 shows an embodiment of a relay which is slightly different than the embodiment in FIG. 1.

Figure 3:
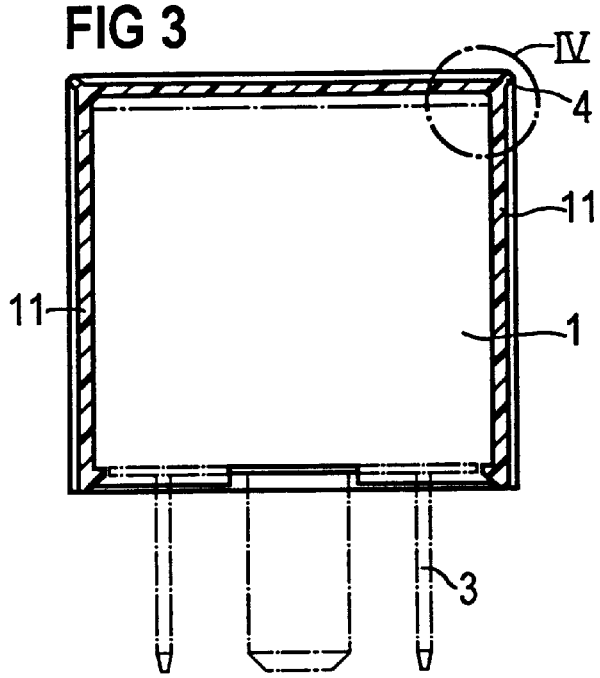
FIG. 3 shows a longitudinal section through the relay housing as shown in FIG. 1.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

FIG. 1 shows, as an embodiment of a component according to the invention, a relay having a parallelepipedal or cube-shaped housing 1 which is formed by a housing cap and a base, which cannot be seen. Emerging on the underside 2 of the housing are blade terminals 3 embedded in the base. All the outer edges between the walls of the housing cap have continuous ribs 4 integrally formed on them, and these ribs extend outward, with a relatively small cross section, in the direction of the center perpendicular between two housing sides 11 in each case. Only toward the underside 2 of the housing are such projections or ribs unnecessary, since the blade terminals or other connection elements project outward on this side anyway.

The ribs 4 on the outer edges of the cap ensure a damping effect should the relay be dropped onto a hard floor and land on one of the five side faces or one of the edges. However, if the impact of the collision exceeds a specified limit at which the function of the component would be expected to be impaired, this impairment becomes identifiable on account of one of the ribs being permanently deformed. If the underside 2 hits the ground, the connection pins or blade terminals 3 would become visibly bent, so that the handling error can also be identified in this case, as previously. For housings which have sunken connectors or connection pins, the projections may be provided on the outer contours on all sides (i.e. on 12 outer edges of the parallelepipedal housing).

The ribs 4 shown in FIG. 1 can be produced particularly easily by injection molding together with the cap in a slideless injection mold. They may be produced from the same material as the housing itself or else from a thermoplastic which is elastic, for example, using the two-component injection molding process.

Instead of the ribs 4, projections may be chosen in any other shapes. FIG. 2, for example, shows an embodiment in which the ribs are interrupted at the top of the housing, so that individual nubs 5 are formed. These nubs could, of course, also be shaped differently, for example in the form of pins or cones. They could also be provided on the side faces, offset from the housing edges. It must merely be ensured that, should the housing hit a floor with one of the five side faces, the initial collision is with at least one projection.

FIG. 3 shows a section through the housing cap of a relay as shown in FIG. 1 (without interior structure). Here, it can be seen that the ribs 4 extend outward in the direction of the perpendicular to the angle between two housing sides 11. In this way, one rib acts as impact damper or as impact marker for two adjacent housing sides in each case.

Figure 4:
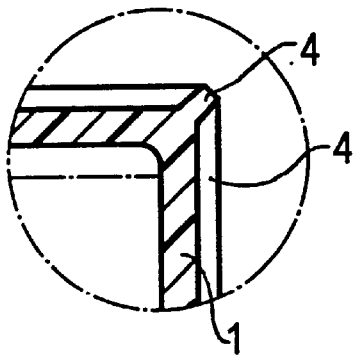
FIG. 4 shows a section of detail IV from FIG. 3.

FIG. 4 shows an enlarged detail of the cross section through a rib.

Figure 5:
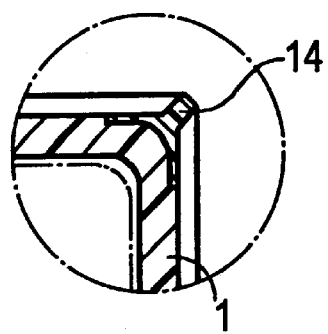
FIG. 5 shows a modification of the section of detail in FIG. 4.

FIG. 5 shows the same section of detail as FIG. 4, but with the modification that a rib 14 is made of a different material than the housing 1.

From the above description, it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed is:

1. An electrical component comprising:
a housing including a first side through which a plurality of connecting elements extend and five other sides, said first side and said five other sides defining a housing interior, the five other sides each comprising at least one deformable projection extending outwardly therefrom, the at least one deformable projection on each of the five other sides being elastically deformable up to a specified impact stress and being disposed relative to said five other sides to substantially damp impact stresses up to said specified impact stress and substantially preclude said impact stresses up to said specified impact stress from reaching said housing interior, and being deformable at impact stresses exceeding the specified impact stress.

2. The electrical component of claim 1 wherein the housing is fabricated from a plastic and the five other sides and the deformable projections are integrally formed from said plastic.

3. The electrical component of claim 1 wherein the five other sides of the housing are fabricated from a first plastic material and the deformable projections are fabricated from a second plastic material, the first plastic material having a greater stiffness than the second plastic material, the five other sides and the deformable projections being injection molded utilizing a two-component injection molding process.

4. The electrical component of claim 1 wherein the housing is parallelpiped-shaped and the five other sides define eight edges, the deformable projections being disposed along said eight edges.

5. The electrical component of claim 1 wherein the housing is cubically shaped and the five other sides define eight edges, the deformable projections being disposed along said eight edges.

6. The electrical component of claim 1 wherein the deformable projections comprise elongated ribs.

7. The electrical component of claim 1 wherein the deformable projections comprise elongated nubs.

8. The electrical component of claim 1 wherein the deformable projections comprise elongated interrupted ribs.

9. An electrical component comprising:

a cubical housing comprising a base through which a plurality of connecting pins extend, four sidewalls and a top wall, the four sidewalls defining four vertical edges, the four sidewalls and top wall defining four horizontal edges, the vertical and horizontal edges each comprising at least one deformable projection extending outwardly therefrom, each deformable projection being elastically deformable up to a predetermined impact stress and deformable at impact stresses exceeding the predetermined impact stress.

10. The electrical component of claim 9 wherein the four sidewalls and top wall are fabricated from a plastic and the deformable projections are integrally formed from said plastic.

11. The electrical component of claim 9 wherein the four sidewalls and top wall are fabricated from a first plastic material and the deformable projections are fabricated from a second plastic material, the first plastic material having a greater stiffness than the second plastic material, the four sidewalls, top wall and deformable projections being injection molded in a two-component injection molding process.

12. The electrical component of claim 9 wherein the deformable projections comprise elongated ribs.

13. The electrical component of claim 9 wherein the deformable projections comprise elongated nubs.

14. The electrical component of claim 9 wherein the deformable projections comprise elongated interrupted ribs.

* * * * *